United States Patent
Kuo et al.

(10) Patent No.: US 9,117,765 B2
(45) Date of Patent: Aug. 25, 2015

(54) MECHANISM FOR FORMING SEMICONDUCTOR DEVICE STRUCTURE

(71) Applicant: Taiwan Semiconductor Manufacturing Co., Ltd, Hsin-Chu (TW)

(72) Inventors: Shih-Chi Kuo, Yangmei (TW); Tsung-Hsien Lee, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/080,152

(22) Filed: Nov. 14, 2013

(65) Prior Publication Data

US 2015/0132963 A1 May 14, 2015

(51) Int. Cl.
*H01L 21/311* (2006.01)
*H01L 21/308* (2006.01)
*H01L 21/306* (2006.01)

(52) U.S. Cl.
CPC ...... *H01L 21/3086* (2013.01); *H01L 21/30604* (2013.01)

(58) Field of Classification Search
CPC .............. H01L 21/31144; H01L 21/0337; H01L 21/0338; H01L 21/3111; H01L 21/32139
USPC ..... 438/689, 694, 703, FOR. 132–FOR. 133; 257/E21.058, E21.035–E21.039
See application file for complete search history.

(56) References Cited

U.S. PATENT DOCUMENTS

| | | | |
|---|---|---|---|
| 2003/0232283 A1* | 12/2003 | Yung et al. | 430/311 |
| 2004/0069745 A1* | 4/2004 | Ho et al. | 216/41 |
| 2006/0015061 A1 | 1/2006 | Kuo et al. | |
| 2009/0203224 A1* | 8/2009 | Shih et al. | 438/780 |
| 2011/0027962 A1* | 2/2011 | Bernstein et al. | 438/386 |
| 2011/0195576 A1* | 8/2011 | Ko et al. | 438/702 |
| 2012/0108043 A1* | 5/2012 | Hatakeyama et al. | 438/514 |

* cited by examiner

*Primary Examiner* — Thao X Le
*Assistant Examiner* — Nduka Ojeh
(74) *Attorney, Agent, or Firm* — Birch, Stewart, Kolasch & Birch, LLP

(57) ABSTRACT

Embodiments of mechanisms of forming a semiconductor device structure are provided. The method includes providing a substrate, forming a first material layer on the substrate, forming a second material layer on the first material layer and forming a first PR layer on the second material layer. The method includes exposing a portion of the first PR layer to a first radiation beam and forming a second PR layer on the first PR layer. The method includes exposing a portion of the second PR layer to a second radiation beam and developing the first PR layer and the second PR layer to form a patterned first PR layer and a patterned second PR layer. The method includes etching a portion of the first material layer and the second material layer by using the patterned first PR layer and the patterned second PR layer as a mask.

18 Claims, 6 Drawing Sheets

MECHANISM FOR FORMING SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

Semiconductor manufacturing technologies include a number of processes which involve complex physical and chemical interactions. Photolithography process is the process of transferring patterns of geometric shapes on a mask to a thin layer of photosensitive material (resist) covering the surface of a semiconductor wafer. The photolithography process is becoming a more sensitive and critical step in IC fabrication process as feature sizes shrink to ever-smaller sizes. However, there are many challenges related to the photolithography process.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional steps can be provided before, during, and after the method, and some of the steps described can be replaced or eliminated for other embodiments of the method.

Embodiments of mechanisms for forming a semiconductor device structure are provided. FIGS. 1A-1D show cross-sectional representations of various stages of forming a semiconductor device structure 100 with two layers having their own respective patterns in accordance with some embodiments of the disclosure. However, it should be noted that FIGS. 1A to 1D have been simplified for the sake of clarity to better understand the inventive concepts of the disclosure. Additional features can be added in semiconductor device structure 100, and some of the features below can be replaced or eliminated.

Figure 1A:
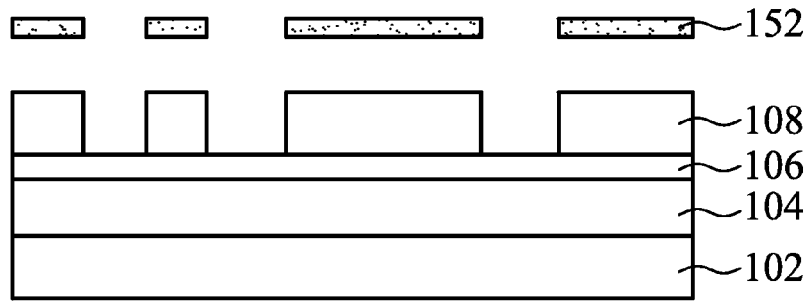
FIGS. 1A-1D show cross-sectional representations of various stages of forming a semiconductor device structure with two layers having their own respective patterns in accordance with some embodiments of the disclosure.

Referring to FIG. 1A, a substrate 102 is provided. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements, are formed in and/or on substrate 102.

Afterwards, a first material layer 104 is formed on substrate 102. A second material layer 106 is formed on first material layer 104. In some embodiments, first material layer 104 is a polysilicon layer, and second material layer 106 is a hard mask layer.

As shown in FIG. 1A, a first photoresist (PR) layer 108 is formed on second material layer 106 and patterned by using a first photomask 152 as a mask. Therefore, patterned PR layer 108 is formed.

In some embodiments, first PR layer 108 is a positive resist (positive tone resist). The positive resist is characterized by the exposed regions becoming more soluble in a developer solution.

Figure 1B:
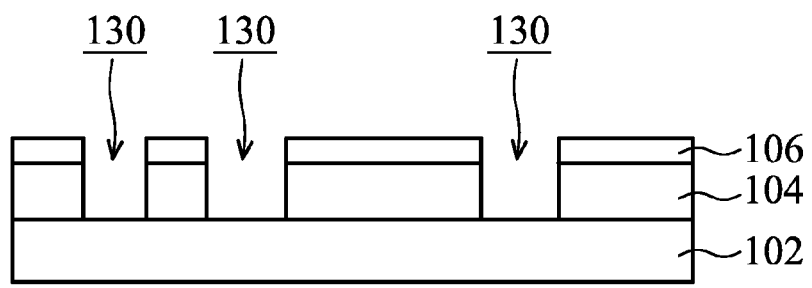

After forming first patterned PR layer 108, a first etching process is performed to remove a portion of first material layer 104 and a portion of second material layer 106 by using patterned first PR layer 108 as the mask as shown in FIG. 1B in accordance with some embodiments of the disclosure. Therefore, one or more trenches 130 are formed in first material layer 104 and through second material layer 106. Afterwards, patterned first PR layer 108 is removed.

As shown in FIG. 1A to FIG. 1B, first material layer 104 and second material layer 106 are patterned by one complete patterning process. The complete patterning process includes photolithography process and etching process. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process.

Figure 1C:
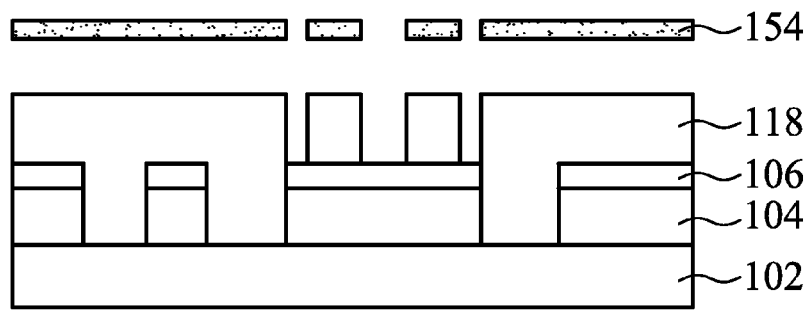

After trenches 130 are formed, a second PR layer 118 is filling into trenches 130 and on second material layer 106 as shown in FIG. 1C in accordance with some embodiments of the disclosure. Afterwards, second PR layer 118 is patterned by using a second photomask 154 as the mask. Therefore, patterned second PR layer 118 is formed.

Figure 1D:
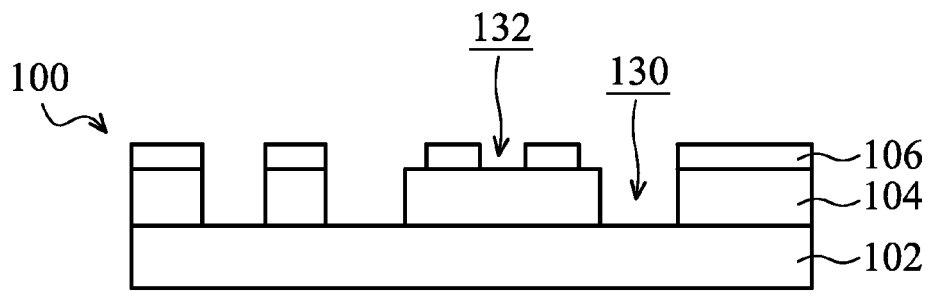

Second material layer 106 is etched by using patterned second PR layer 118 as the mask to form semiconductor device structure 100 as shown in FIG. 1D in accordance with some embodiments of the disclosure. Afterwards, second PR layer 118 is removed.

Therefore, first material layer 104 and second material layer 106 have their own respective patterns. It should be noted that second PR layer 118 is patterned to form openings 132 by another complete patterning process. In order to form different patterns in first material layer 104 and second material layer 106, two complete patterning processes are used.

FIGS. 2A-2D show cross-sectional representations of various stages of forming a semiconductor device structure 200 with multiple depths in accordance with some embodiments of the disclosure.

Figure 2A:
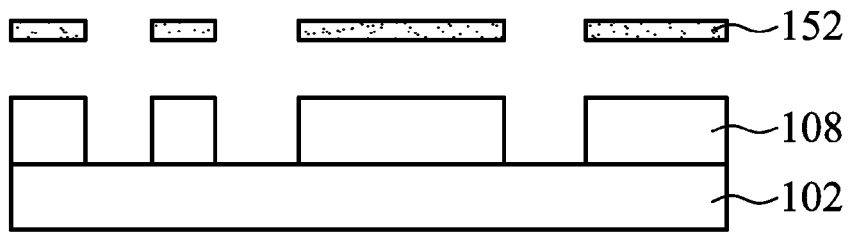
FIGS. 2A-2D show cross-sectional representations of various stages of forming a semiconductor device structure with multiple depths in accordance with some embodiments of the disclosure.

As shown in FIG. 2A, first PR layer 108 is formed on substrate 102. Afterwards, first PR layer 108 is patterned by using first photomask 152 as the mask to form patterned PR layer 108.

Figure 2B:
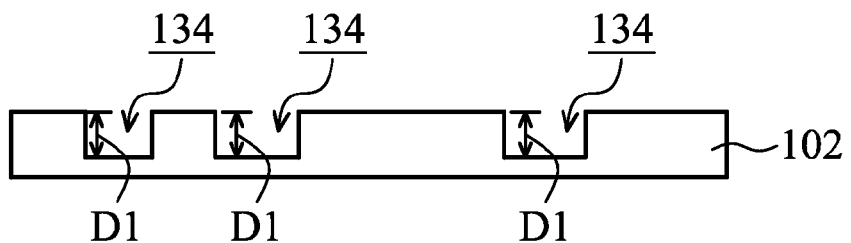

After patterned PR layer 108 is formed, substrate 102 is etched by using patterned PR layer 108 as the mask as shown in FIG. 2B in accordance with some embodiments of the disclosure. Therefore, one or more recesses 134 are formed in substrate 102. In some embodiments, recesses 134 have a depth D1.

Figure 2C:
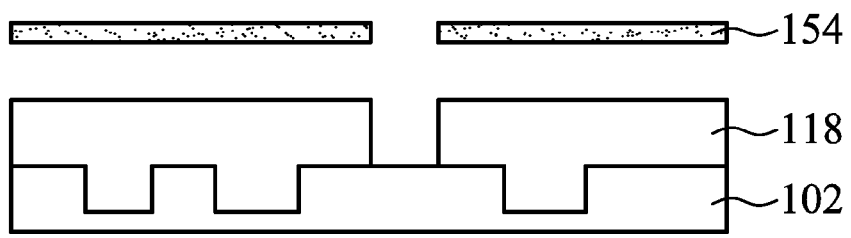

After recesses 134 are formed, second PR layer 118 is filled into recesses 134 and on substrate 102 as shown in FIG. 2C in accordance with some embodiments of the disclosure. Afterwards, second PR layer 118 is patterned by second photomask 154 as the mask to form patterned second PR layer 118.

Figure 2D:
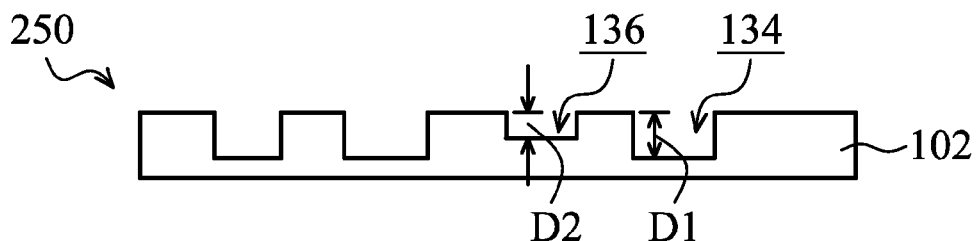

After forming patterned second PR layer 118, a portion of substrate 102 which is not protected by patterned second PR layer 118 is etched as shown in FIG. 2D in accordance with some embodiments of the disclosure. Therefore, one or more vias 136 are formed in substrate 102. In some embodiments, each of vias 136 has a depth D2. Depth D2 is smaller than depth D1. Therefore, as shown in FIG. 2D, a semiconductor device structure 200 has multiple depths.

It should be noted that semiconductor device structure 100 with two layers having their own respective patterns are formed by two complete patterning processes, as shown in FIG. 1A-1D. In addition, semiconductor device structure 200 with multiple depths is also formed by two complete patterning processes, as shown in FIG. 2A-2D.

However, two complete patterning processes are time-consuming and have high cost. In addition, because of the potential for an overlapping error between first PR layer 108 and second PR layer 118, first material layer 104, second material layer 106 or substrate 102 may be over-etched. Therefore, some embodiments are provided to solve the overlapping error and reduce the fabrication time and cost.

FIGS. 3A-3F show cross-sectional representations of various stages of forming semiconductor device structure 100 with two layers having their own respective patterns in accordance with some embodiments of the disclosure.

Figure 3A:
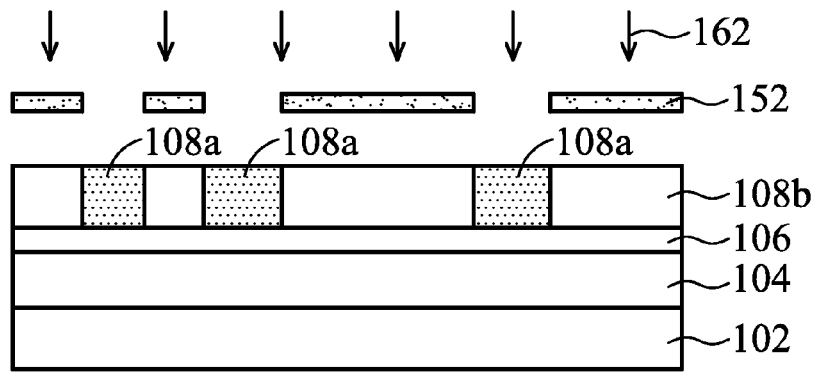
FIGS. 3A-3F show cross-sectional representations of various stages of forming a semiconductor device structure with two layers having their own respective patterns in accordance with some embodiments of the disclosure.

As shown in FIG. 3A, first material layer 104 and second material layer 106 are sequential formed on substrate 102. In some embodiments, first material layer 104 is a poly silicon layer. In some embodiments, second material layer 106 is a hard mask layer. The hard mask layer includes silicon nitride, or silicon oxynitride.

Afterwards, first photoresist (PR) layer 108 is formed on second material layer 106. First photomask 152 is disposed on second material layer 108. A portion of first PR layer 108 is exposed to first radiation beam 162 to form patterned first PR layer 108. Patterned first PR layer 108 has a first exposed region 108a and a first non-exposed region 108b.

First photomask 152 may be a binary mask, a phase shift mask, an attenuated phase-shift mask (Att-PSM), an alternating aperture phase shift mask (Alt-PSM), a chromeless phase shift mask (CPL), and/or other applicable mask types. In some embodiments, first PR layer 108 is a positive resist (positive tone resist). First radiation beam 162 may be ultraviolet (UV) radiation or extreme ultraviolet (EUV) radiation.

Figure 3B:
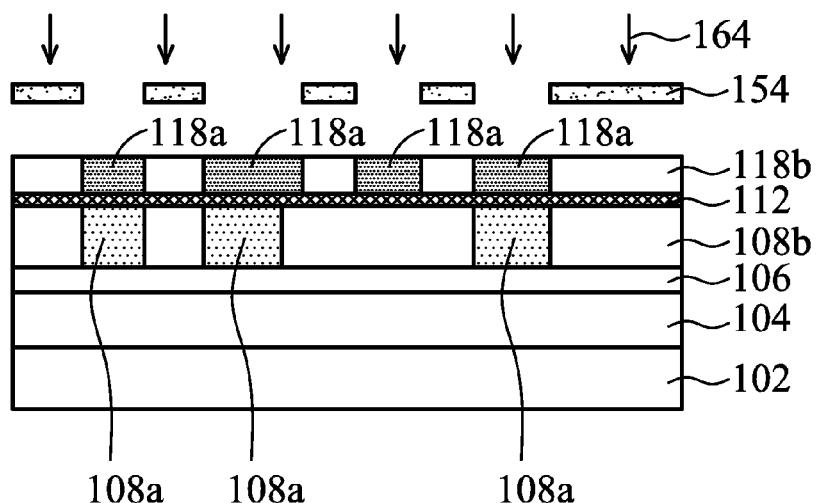

After patterned first PR layer 108 is formed, second PR layer 118 is formed on first PR later 108 as shown in FIG. 3B in accordance with some embodiments of the disclosure. Afterwards, second photomask 154 is disposed on second PR layer 118. A portion of second PR layer 118 is exposed to second radiation beam 164 to form patterned second PR layer 118. Patterned second PR layer 118 has second exposed region 118a and second non-exposed region 118b. In some embodiments, second PR layer 118 is a positive resist (positive tone resist).

As shown in FIG. 3B, an anti-reflection layer 112 is formed between first PR layer 108 and second PR layer 118. Anti-reflection layer 112 is used to reduce reflection and to prevent second radiation beam 164 passing into first PR layer 108. Therefore, the patterns of first exposed region 108a of first PR layer 108 are not affected by second radiation beam 164.

In some embodiments, anti-reflection layer 112 is made of a photoresist material. In some other embodiments, no anti-reflection layer is formed between first PR layer 108 and second PR layer 118.

Figure 3C:
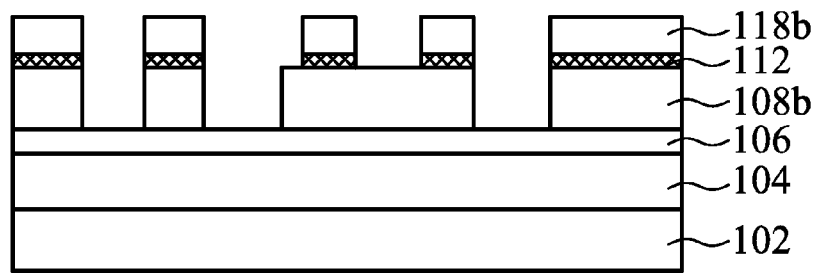

After patterned second PR layer 118 is formed, first PR layer 108 and second PR layer 118 are developed as shown in FIG. 3C in accordance with some embodiments of the disclosure. Because first PR layer 108 and second PR layer 118 are positive resist (positive tone resist), first exposed region 108a and second exposed region 108a are removed when first PR layer 108 and second PR layer 118 are put in a developer solution. Therefore, as shown in FIG. 3C, patterned first PR layer 108 and patterned second PR layer 118 are formed.

Figure 3D:
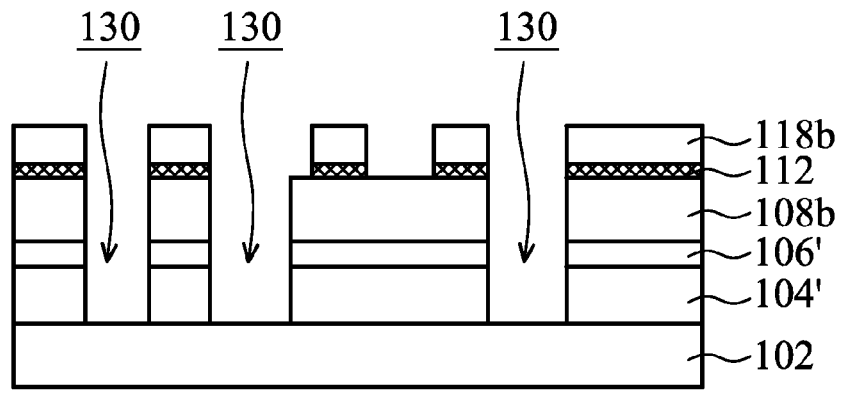

After patterned first PR layer 108 and patterned second PR layer 118 are formed, a portion of first material layer 104 and a portion of second material layer 106 which are not covered by first non-exposed region 108b of first PR layer 108 are etched as shown in FIG. 3D in accordance with some embodiments of the disclosure. Therefore, a patterned first material layer 104' is formed. The pattern of patterned first material layer 104' corresponds to the pattern of first non-exposed region 108b of PR layer 108. The pattern of patterned first material layer 104' has one or more trenches 130.

Figure 3E:
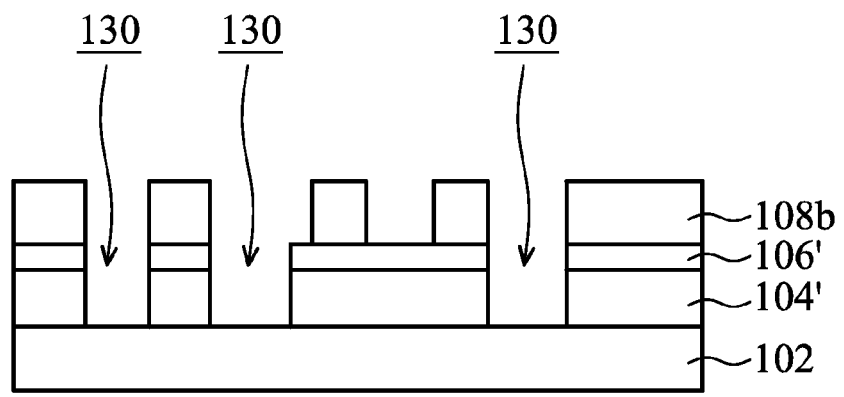

Afterwards, second PR layer 118 is removed to leave a portion of first PR layer 108. The remaining first non-exposed region 108b has a pattern corresponding to the pattern of second PR layer 118 as shown in FIG. 3E in accordance with some embodiments of the disclosure.

Figure 3F:
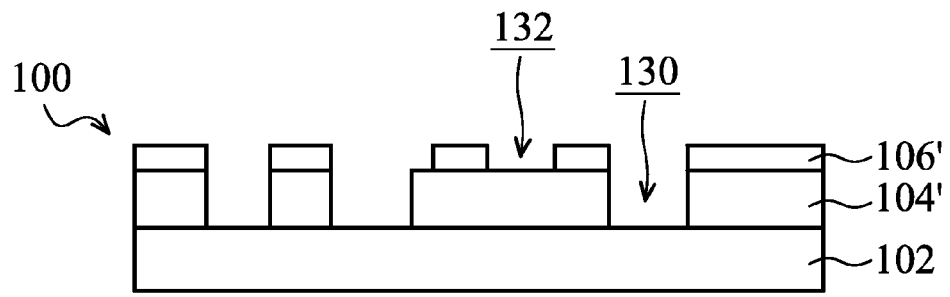

Afterwards, second material layer 106 is etched by using remaining first PR layer 108b as the mask to form semiconductor device structure 100 as shown in FIG. 3F in accordance with some embodiments of the disclosure. Therefore, a patterned second material layer 106' is formed. The pattern of patterned second material layer 106' corresponds to the pattern of remaining first non-exposed region 108b. Therefore, patterned second material layer 106' has one or more opening 132. A portion of the pattern of trenches 130 overlaps a portion of the pattern of opening 132.

Patterned first material layer 104' and patterned second material layer 106' have their own respective patterns. It should be noted that first PR layer 108 and second PR layer 118 are exposed by two radiation beam, but are simultaneously developed by a single developing operation. Compared to two complete patterning processes, the fabrication method as shown in FIG. 3A-3F is simple and time-saving. In addition, because first PR layer 108 and second PR layer 118 are developed simultaneously, the overlapping error is avoided.

FIGS. 4A-4D show cross-sectional representations of various stages of forming semiconductor device structure 100 with two layers having their own respective patterns in accordance with some embodiments of the disclosure.

Figure 4A:
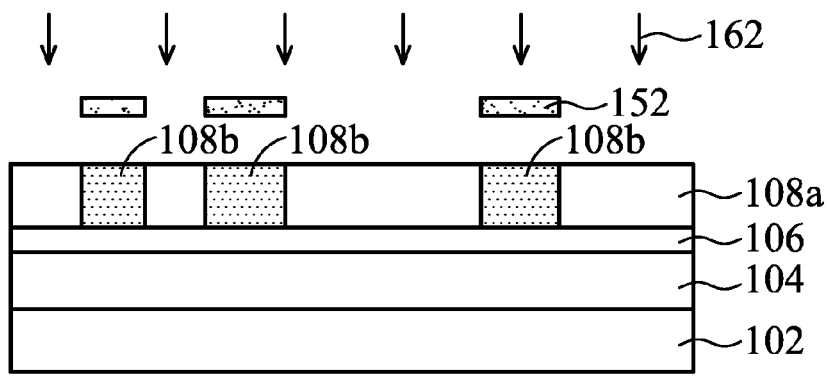
FIGS. 4A-4D show cross-sectional representations of various stages of forming a semiconductor device structure with two layers having their own respective patterns in accordance with some embodiments of the disclosure.

FIG. 4A is similar to FIG. 3A, the difference between FIG. 3A and FIG. 4A being that first PR layer 108 is a negative resist in FIG. 4A. The negative resist is characterized by the non-exposed regions becoming more soluble in a developer solution.

As shown in FIG. 4A, photomask 152 is disposed over first PR layer 108. A portion of first PR layer 108 is exposed to first radiation beam 162 to form patterned first PR layer 108. Therefore, patterned first PR layer 108 is formed to have first exposed region 108a and first non-exposed region 108b.

Figure 4B:
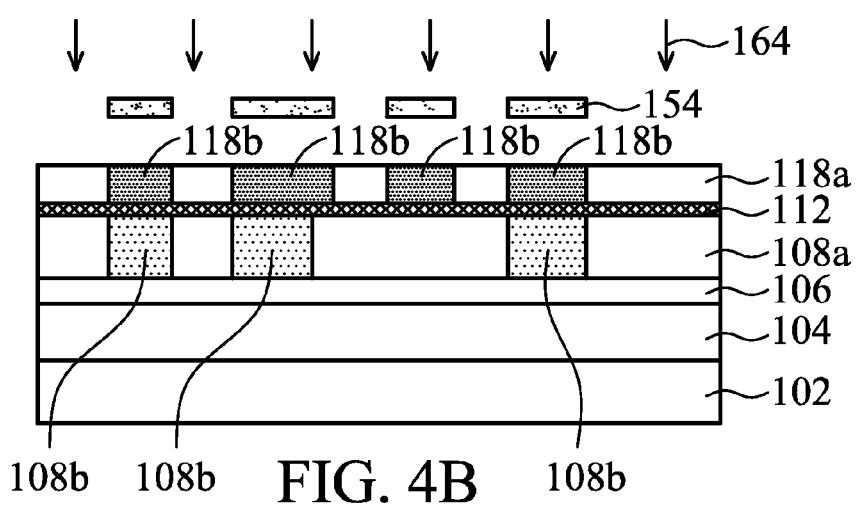

After patterned first PR layer 108 is formed, anti-reflection layer 112 is optionally formed on first PR layer 108, and second PR layer 118 is formed over first PR layer 108 as shown in FIG. 4B in accordance with some embodiments of the disclosure. Therefore, patterned second PR layer 118 is formed to have second exposed region 118a and second non-exposed region 118b. In some embodiments, second PR layer 118 is a negative resist.

Figure 4C:
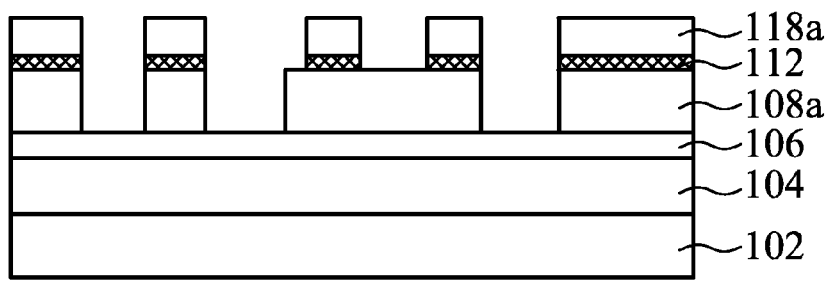

After patterned second PR layer 118 is formed, first PR layer 108 and second PR layer 118 are developed as shown in FIG. 4C in accordance with some embodiments of the disclosure. Because first PR layer 108 and second PR layer 118 are negative resist (negative tone resist), first non-exposed region 108b and second non-exposed region 108b are removed when first PR layer 108 and second PR layer 118 are put in a developer solution. Therefore, as shown in FIG. 4C, patterned first PR layer 108 and patterned second PR layer 118 are formed.

Figure 4D:
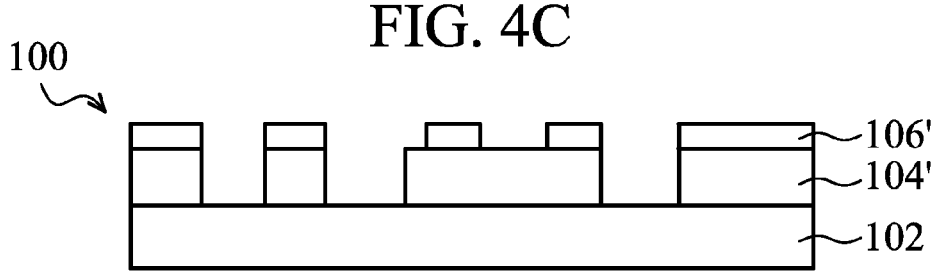

Afterwards, a portion of first material layer 104 and a portion of second material layer 106 are etched by using patterned first PR layer 108 and patterned second PR layer 118 as the mask as shown in FIG. 4D in accordance with some embodiments of the disclosure. Therefore, semiconductor device structure 100 having patterned first material layer 104' and patterned second material layer 106' is formed. Patterned first material layer 104' and patterned second material layer 106' have their own respective patterns and are formed by two exposing operations and a single developing operation. As a result, fabrication time and cost are reduced and the overlapping error is avoided.

FIGS. 5A-5D show cross-sectional representations of various stages of forming a semiconductor device structure with multiple depths in accordance with some embodiments of the disclosure.

Figure 5A:
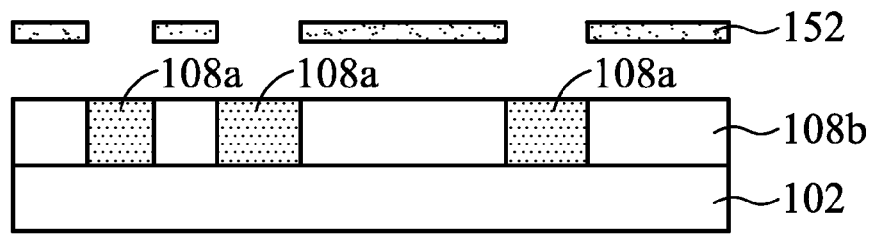
FIGS. 5A-5D show cross-sectional representations of various stages of forming a semiconductor device structure with multiple depths in accordance with some embodiments of the disclosure.

As shown in FIG. 5A, first PR layer 108 is formed on substrate 102. First PR layer 108 is exposed to first radiation beam 162 by using photomask 152 as the mask to form a patterned first PR layer 108. Patterned first PR layer 108 has first exposed region 108a and first non-exposed region 108b. In some embodiments, first PR layer 108 is a positive resist. In some other embodiments, first PR layer 108 is a negative resist.

Figure 5B:
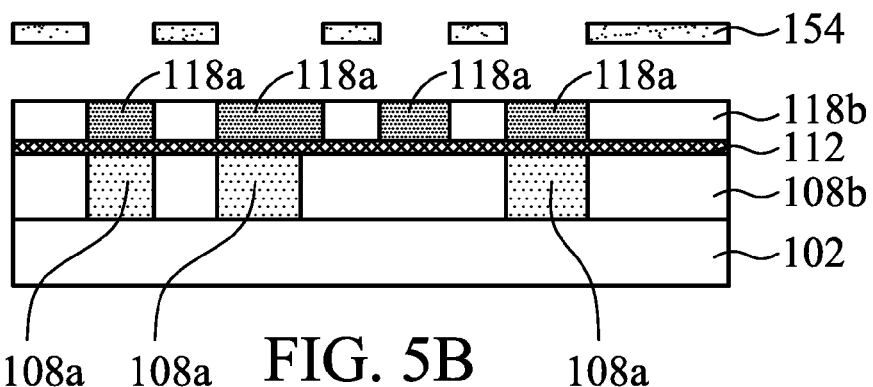

After patterned first PR layer 108 is formed, anti-reflection layer 112 is optionally formed on first PR layer 108, and second PR layer 118 is formed over first PR layer 108 as shown in FIG. 5B in accordance with some embodiments of the disclosure. Therefore, second PR layer 118 is exposed to second radiation beam 164 by using photomask 154 as the mask to form patterned second PR layer 118. Patterned second PR layer 118 has exposed region 118a and non-exposed region 118b. In some embodiments, second PR layer 118 is a positive resist.

Figure 5C:
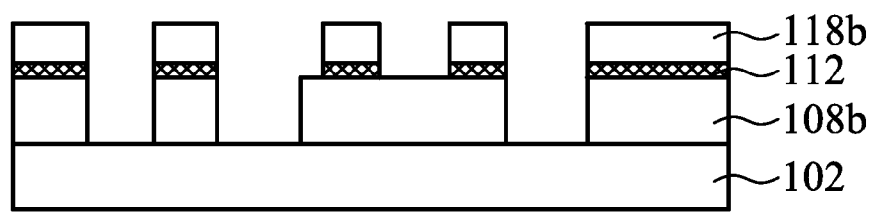

After patterned second PR layer 118 is formed, first PR layer 108 and second PR layer 118 are developed as shown in FIG. 5C in accordance with some embodiments of the disclosure. Because first PR layer 108 and second PR layer 118 are positive resist (positive tone resist), first exposed region 108a and second exposed region 118a are removed when first PR layer 108 and second PR layer 118 are put in a developer solution. Therefore, as shown in FIG. 5C, patterned first PR layer 108 and patterned second PR layer 118 are formed.

Figure 5D:
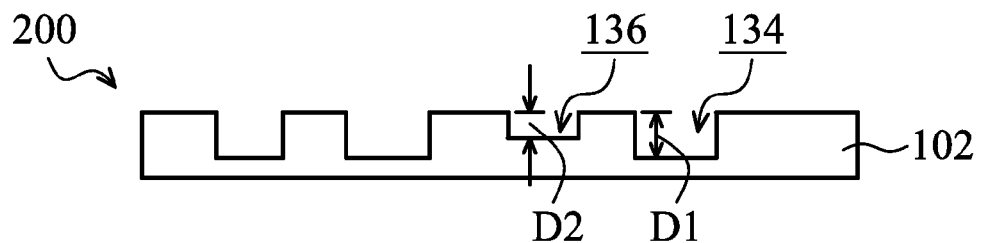

Afterwards, substrate 102 is etched by using patterned first PR layer 108 and patterned second PR layer 118 as the mask as shown in FIG. 5D in accordance with some embodiments of the disclosure. Therefore, semiconductor device structure 200 with one or more recesses 134 and vias 136 is formed. In some embodiments, recess 134 has a depth D1, and via 136 has a depth D2. Depth D1 is greater than depth D2.

Embodiments of mechanisms of forming a semiconductor device structure are provided. The semiconductor device structure with two layers having their own respective patterns is formed by a simple fabrication method. Two PR layers are formed over a first material layer and a second material layer. The method including a single developing operation follows two exposing operations. Therefore, the first material layer and the second material layer have their own respective patterns by using two patterned PR layers as the mask. In addition, another semiconductor device structure having multiple depths is obtained by the simple fabrication method which includes a single developing operation and two exposing operations. Therefore, fabrication time and cost for forming the semiconductor device structure with two layers having their own respective patterns or with multiple depths are decreased, and the overlapping error is avoided.

In some embodiments, a method for forming a semiconductor device structure is provided. The method includes providing a substrate, forming a first material layer on the substrate, forming a second material layer on the first material layer and forming a first photoresist (PR) layer on the second material layer. The method also includes exposing a portion of the first PR layer to a first radiation beam and forming a second PR layer on the first PR layer after exposing the portion of the first PR layer. The method further includes exposing a portion of the second PR layer to a second radiation beam and developing the first PR layer and the second PR layer to form a patterned first PR layer and a patterned second PR layer. The method includes etching a portion of the first material layer and a portion of the second material layer by using the patterned first PR layer and the patterned second PR layer as a mask.

In some embodiments, a method for forming a semiconductor device structure is provided. The method includes providing a substrate, forming a first material layer and a second material mater layer on the substrate and forming a first photoresist (PR) layer on the second material layer, wherein the first PR layer has a first exposed region and a first non-exposed region. The method also includes forming a second PR layer on the first material layer. The second PR layer has a second exposed region and a second non-exposed region. The method further includes developing the first PR layer and the second PR layer to form a patterned first PR layer and a patterned second PR layer; and etching a portion of the first material layer and a portion of the second material layer by using the patterned first PR layer and the patterned second PR layer as a mask.

In some embodiments, a method for forming a semiconductor device structure is provided. The method includes providing a substrate, forming a first photoresist (PR) layer on the substrate and exposing a portion of the first PR layer to a first radiation beam. The method also includes forming a second PR layer on the first PR layer after exposing the portion of the first PR layer and exposing a portion of the second PR layer to a second radiation beam. The method further includes developing the first PR layer and the second PR layer to form a patterned first PR layer and a patterned second PR layer and etching a portion of the substrate by using the patterned first PR layer and the patterned second PR layer as a mask to form multiple depths in the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor device structure, comprising:
   providing a substrate;
   forming a first material layer on the substrate;
   forming a second material layer on the first material layer;
   forming a first photoresist (PR) layer on the second material layer;
   exposing a portion of the first PR layer to a first radiation beam;
   forming a second PR layer on the first PR layer after exposing the portion of the first PR layer;
   exposing a portion of the second PR layer to a second radiation beam;
   simultaneously developing the first PR layer and the second PR layer to form a patterned first PR layer and a patterned second PR layer; and
   etching a portion of the first material layer and a portion of the second material layer by using the patterned first PR layer and the patterned second PR layer as a mask,
   wherein etching a portion of the first material layer and a portion of the second material layer comprises:
      etching the first material layer and the second material layer to form a patterned first material layer, wherein a first pattern of the patterned first material layer corresponds to a pattern of the patterned first PR layer; and
      etching the second material layer to form a patterned second material layer, wherein a second pattern of the patterned second material layer corresponds to a pattern of the patterned second PR layer.

2. The method for forming a semiconductor device structure as claimed in claim 1, further comprising:
   forming an anti-reflection layer between the first PR layer and the second PR layer.

3. The method for forming a semiconductor device structure as claimed in claim 2, wherein the anti-reflection layer is made of a photoresist material.

4. The method for forming a semiconductor device structure as claimed in claim 1, wherein the first material layer is a polysilicon layer.

5. The method for forming a semiconductor device structure as claimed in claim 1, wherein the second material layer is a hard mask layer.

6. The method for forming a semiconductor device structure as claimed in claim 1, wherein the first PR layer and the second PR layer both are positive PR.

7. The method for forming a semiconductor device structure as claimed in claim 1, wherein the first PR layer and the second PR layer both are negative PR.

8. The method for forming a semiconductor device structure as claimed in claim 1, wherein a portion of the first pattern overlaps a portion of the second pattern.

9. A method for forming a semiconductor device structure, comprising:
   providing a substrate;
   forming a first material layer and a second material mater layer on the substrate;
   forming a first photoresist (PR) layer on the second material layer, wherein the first PR layer has a first exposed region and a first non-exposed region;
   forming a second PR layer on the first material layer, wherein the second PR layer has a second exposed region and a second non-exposed region, and wherein a portion of the first exposed region overlaps a portion of the second exposed region;

simultaneously developing the first PR layer and the second PR layer to form a patterned first PR layer and a patterned second PR layer; and etching a portion of the first material layer and a portion of the second material layer by using the patterned first PR layer and the patterned second PR layer as a mask.

10. The method for forming a semiconductor device structure as claimed in claim 9, wherein developing the first PR layer and the second PR layer comprises:

removing the first exposed region and the second exposed region.

11. The method for forming a semiconductor device structure as claimed in claim 9, wherein developing the first PR layer and the second PR layer comprises:

removing the first non-exposed region and the second non-exposed region.

12. The method for forming a semiconductor device structure as claimed in claim 9, further comprising:

forming an anti-reflection layer between the first PR layer and the second PR layer.

13. The method for forming a semiconductor device structure as claimed in claim 9, wherein the first PR layer and the second PR layer both are positive PR.

14. The method for forming a semiconductor device structure as claimed in claim 9, wherein the first PR layer and the second PR layer both are negative PR.

15. A method for forming a semiconductor device structure, comprising:

providing a substrate;

forming a first photoresist (PR) layer on the substrate;

exposing a portion of the first PR layer to a first radiation beam, wherein the first PR layer has a first exposed region and a first non-exposed region;

forming a second PR layer on the first PR layer after exposing the portion of the first PR layer, wherein the second PR layer has a second exposed region and a second non-exposed region, and a portion of the first exposed region overlaps a portion of the second exposed region;

exposing a portion of the second PR layer to a second radiation beam;

simultaneously developing the first PR layer and the second PR layer to form a patterned first PR layer and a patterned second PR layer; and etching a portion of the substrate by using the patterned first PR layer and the patterned second PR layer as a mask to form multiple depths in the substrate.

16. The method for forming a semiconductor device structure as claimed in claim 15, further comprising:

forming an anti-reflection layer between the first PR layer and the second PR layer.

17. The method for forming a semiconductor device structure as claimed in claim 15, wherein etching the substrate comprises:

etching the substrate to a first depth, wherein a pattern of the first depth corresponds to a pattern of the patterned first PR layer;

etching the substrate to a second depth, wherein a pattern of the second depth corresponds to a pattern of the patterned second PR layer.

18. The method for forming a semiconductor device structure as claimed in claim 17, wherein the first depth is greater than second depth.

* * * * *